United States Patent [19]

Lin

[11] Patent Number: 5,128,894
[45] Date of Patent: Jul. 7, 1992

[54] MULTI-VALUE MEMORY CELL USING RESONANT TUNNELLING DIODES

[75] Inventor: Hung C. Lin, Silver Spring, Md.

[73] Assignee: University of Maryland, College Park, Md.

[21] Appl. No.: 590,139

[22] Filed: Sep. 28, 1990

[51] Int. Cl.⁵ .............. G11C 5/06; G11C 11/56; G11C 11/36
[52] U.S. Cl. .................. 365/168; 365/71; 365/72; 365/175
[58] Field of Search ............. 365/71, 72, 168, 175; 307/322

[56] References Cited

U.S. PATENT DOCUMENTS

| | | | |
|---|---|---|---|
| 3,120,653 | 2/1964 | Miller et al. | 365/71 |
| 3,996,484 | 12/1976 | Abraham | 307/322 |
| 4,573,143 | 2/1986 | Matsukawa | 365/175 |
| 4,853,753 | 8/1989 | Capasso et al. | 357/4 |
| 4,907,045 | 3/1990 | Ando | 257/22 |
| 4,956,681 | 10/1990 | Yokoyama et al. | 365/168 |

OTHER PUBLICATIONS

Signal Processing with Vertically-Integrated Resonant Tunneling Diodes, 1990 International Symposium on Circuits and Systems, Robert C. Potter et al. pp. 2557-2561.

IRE Transactions on Electronic Computers, Esaki Diode High-Speed Logical Circuits, E. Goto, et al., Mar. 1960, pp. 25 and 29

Primary Examiner—Joseph A. Popek
Assistant Examiner—Jack A. Lane
Attorney, Agent, or Firm—Oblon, Spivak, McClelland, Maier & Neustadt

[57] ABSTRACT

A memory cell for multi-value logic. Two devices with multiple peak folding characteristics, such as the V-I characteristics of resonant tunneling diodes, are connected in series across a power supply. Multiple stable operating points are established where the positive resistance portions of the respective folding voltage-current characteristics intersect and correspond to multiple quantized levels for storing information, creating a multi-valued memory cell.

12 Claims, 3 Drawing Sheets

MULTI-VALUE MEMORY CELL USING RESONANT TUNNELLING DIODES

BACKGROUND OF THE INVENTION

1. Field of the Invention

The present invention relates to the field of memory devices, and in particular, to memory devices with the ability to store multiple logical states.

2. Description of the Background

Semiconductor memory today is based on a binary system. In each cell of a binary system memory, only two logical states can be stored, namely, "1" or "0". If the number of logical state in a memory cell can be increased without increasing the area of the cell, then the memory density can be increased. Since the semiconductor memory constitutes the most widely used product in integrated circuits today, increasing the memory density is highly desirable.

FIGS. 1a and 1b show the folding electrical characteristics, i.e. having positive (R1 and R3) and negative ($-R2$ and $-R4$) resistance sections, and a circuit diagram, respectively, of a 2-peak resonant tunneling diode (RTD). FIGS. 2a and 2b show the folding characteristics and a circuit diagram of a multiple-peak RTD. Here, each triangle of the circuit diagram corresponds to a current peak. Such RTDs have been used in ternary logic systems and memory cells as disclosed in U.S. Pat. No. 4,853,753 by Capasso et al, Potter et al (1990 International Symposium on Circuits and Systems, Digest of Papers pp. 2557-2561), and U.S. Pat. No. 4,907,045 by Ando. In Capasso et al, a memory cell is disclosed employing RTDs with multiple peak folding characteristics where stable operating points are defined where a load line of a resistor external to the cell intersects the positive resistance sections of the folding characteristics. Such cells require careful processing as a change in resistance can limit and vary the position of the stable operating points, these points being used to define multiple logic states.

SUMMARY OF THE INVENTION

Accordingly, one object of the present invention is to provide a novel memory cell which increases the density of semiconductor memory.

Another object of the present invention is to increase the number of logical states of a semi-conductor memory cell to a number greater than two, i.e., be multi-valued.

Still another object of this invention is to provide a simple semiconductor memory system.

A further object is to provide a new and improved analog memory system.

These and other objects are achieved by providing new and improved semiconductor memory cell utilizing the folding voltage-current (V-I) characteristics of two devices connected in series to produce plural stable operating points, each point representing a logic state. Such folding V-I characteristics can be obtained by means of resonant tunneling diodes (RTD).

The two devices are connected in series across a power supply in a pull-up/pull-down arrangement, and form a pair of folding characteristics which are used to define the stable operating points of the memory cell. The stable operating points are determined by intersections of the positive resistance portions of the two folding characteristics, the intersections being determined by overlaying the pull-up folding characteristics with the pull-down folding characteristics plotted in reverse with respect to the voltage axis.

A resistor may be placed in series with at least one of the two devices to skew the corresponding folding characteristics. The power supply may be varied to result in the pull-down characteristics intersecting each positive resistance portion of the pull-up device twice, providing $2n+1$ logic states for devices with n-peak folding characteristics. The power supply can be varied within a range determined by the amount of skew and the voltage difference between adjacent peaks of the folding characteristics.

These multiple stable operating points can be set by "writing" into the cell an analog voltage signal. Multiple values of voltages can then stored, and can later be sensed during a "reading" period.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1b is a schematic diagram of a conventional RTD having the folding V-I characteristics shown in FIG. 1a;

FIG. 2b is a schematic diagram of a conventional multi-peak RTD having the folding V-I characteristics shown in FIG. 2a;

FIG. 4b is a graphical representation of the skewed folding V-I characteristics of the circuit of FIG. 4a;

DETAILED DESCRIPTION OF THE PREFERRED EMBODIMENTS

Figure 1A:
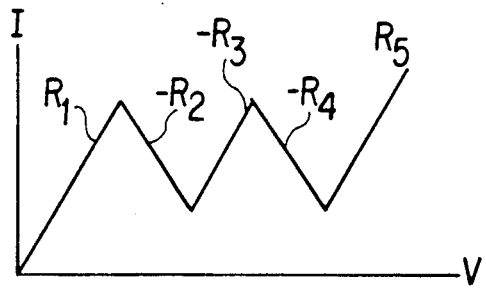
FIG. 1a is a graphical representation of a known two-peak folding V-I characteristics having positive and negative resistance regions.
Figure 1B:
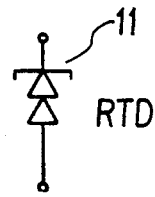

Referring now to the drawings, wherein like reference numerals designate identical or corresponding parts throughout the several views, and more particularly to FIG. 1 thereof, there is illustrated a triangular folding characteristic, typical of the voltage-current relationship of a resonant tunneling diode (RTD). The folding characteristic has a wavy shape. This device shows a two peak folding V-I characteristic with positive resistance along sections R1, R3, and R5, and negative resistance along sections −R2 and −R4. The symbols used here for this two-peak RTD are shown FIG. 1b, where the two triangles represent the two peaks of the folding V-I characteristic.

Figure 2A:
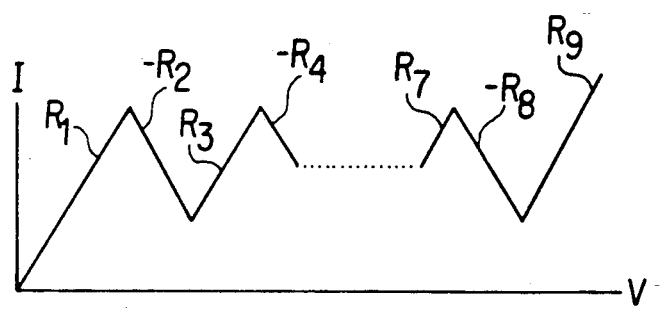
FIG. 2a is a graphical representation of a known multiple peak folding V-I characteristic.
Figure 2B:
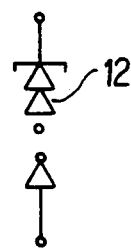

RTDs can have more than two peaks as shown in FIG. 2a, where sections R1, R3, R7, R9 etc. correspond to positive resistance and sections −R2, −R4, −R8 etc., correspond to negative resistance. The dots between section −R4 and R7 represent repetitive folding sections. The diagram of a multi-peak RTD is shown in FIG. 2b where the number of triangles represents the number of peaks of the folding V-I characteristics.

Figure 3A:
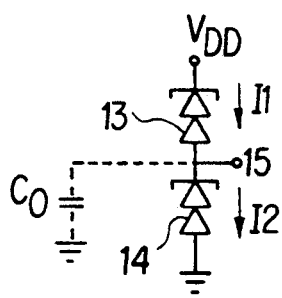
FIG. 3a is a circuit diagram of a memory cell according to the present invention with two 2-peak RTDs in series.

A first embodiment of the memory cell according to the present invention uses two RTD devices in series with each having folding V-I characteristics to produce multiple stable operating points as shown in FIG. 3a. Two RTDs 13 and 14 are connected in series across a power supply VDD and ground. Between the two RTDs 13 and 14 is the output 15. Thus, RTD 13 constitutes a pull-up device and RTD 14 constitutes a pull-down device.

Figure 3B:
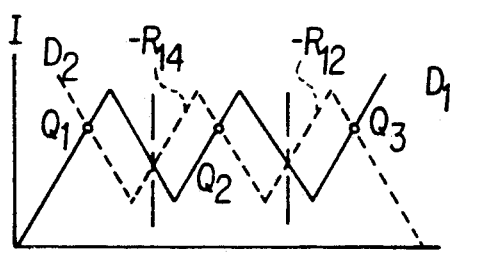
FIG. 3b is a graphical representation of the folding V-I characteristics of the memory cell shown in FIG. 3a with 3 stable operating points.

The operating points of the memory cell according to the invention can be determined graphically as shown in FIG. 3b. Curve D1 represents the folding V-I characteristic of RTD 14, which is the same as folding V-I characteristic shown in FIG. 1a. RTD 13 has a folding V-I characteristic of the same shape. To determine the operating points of the memory cell according to the invention, the folding V-I characteristic of RTD 13 is plotted as dotted lie D2 from the right hand side toward the left hand side starting from VDD along the voltage axis (X-axis). Intersections of the positive resistance sections of the folding V-I characteristics of the two devices 13 and 14 define quiescent operating points. In FIG. 3b, these points are Q1, Q2, Q3. Stable operating points cannot be established in the negative resistance regions. The intersecting points in the negative resistance sections such as those at $V_A$ and $V_B$ are in unstable equilibrium. Any deviation from $V_A$ toward the left causes RTD 14 with characteristic D1 to discharge more current from any stray capacitance $C_O$ at node 15 than for RTD 13 with a characteristic D2 to charge the node capacitance $C_O$. Thus, the node 15 voltage drops toward the operating Q1 in the positive resistance section. Similarly, any deviation in voltage away from $V_A$ towards $V_B$ causes RTD 14 to charge node 15 capacitance $C_O$ more rapidly than RTD 13 discharges the capacitance $C_O$ at node 15. Thus, the voltage at node 15 increases until a stable equilibrium point Q2 is reached.

On the other hand, any voltage deviation from the stable equilibrium operating points, such as Q1, Q2, Q3, causes the voltage at node 15 to fall back to the stable equilibrium operating point due to the charging and discharging actions of RTDs 13 and 14.

During writing of the memory cell according to the present invention any input voltage less than the intersecting voltage $V_A$ in the negative resistance region −R14 settles to the operating point Q1. Any input voltage greater than the intersecting voltage $V_B$ in the negative resistance region −R12 settles to the operating point Q3. Any input voltage lying between intersecting voltages $V_A$ and $V_B$ settles to point Q2.

At the output terminal, there is bound to be some capacitance $C_O$ at terminal 15. The current I1 flowing in the pull-up device 13 charges CO and the current I2 flowing in the pull-down device 14 discharges $C_O$. If the initial voltage is less than that at the quiescent point Q1, I1 is greater than I2 and the capacitance $C_O$ is charged up till the voltage across $C_O$ reaches that at Q1 when equilibrium is reached. For an initial voltage greater than that at Q1 but less than the intersecting voltage $V_B$ of the two RTDs, I1 is less than I1 and the capacitance discharges until the voltage across $C_O$ reaches that at Q1 when equilibrium is reached. Thus, the input voltage is quantized.

During reading of the memory cell, the possible output voltages are those at the stable operating points, in this example Q1, Q2 and Q3.

FIG. 2b shows how two 2-peak RTDs can store 2+1=3 levels of information. If two n-peak RTDs are used, then there are n+1 levels stored.

Figure 4A:
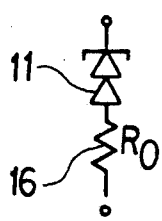
FIG. 4a is a schematic diagram of known series connection of an RTD with a resistor.

When a device with triangular folding V-I characteristics is connected in series with a resistance, then the resultant V-I characteristic D3 becomes skewed. FIG. 4 shows the circuit of an RTD 11 connected in series with a resistance 16. This resistance may be external or internal to the RTD. The resultant V-I characteristic D3 is skewed toward one side because the total voltage drop across the device of FIG. 4a is equal to the RTD voltage drop plus the positive resistance $R_O$ voltage drop. Here, the positive resistance represented by the positive slopes of D3 is different from the negative resistance of D3 represented by the negative slopes.

Figure 4B:
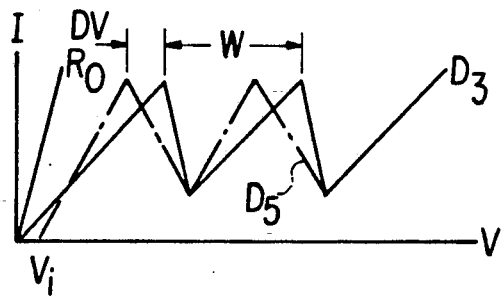

In FIG. 4b, curve D3 represents the skewed characteristic of RTD 11 in series with resistor 16 while D5 represents the characteristics of RTD 11 only. It is to be understood that curve D5 has been shifted to the right so that the minima of curves D3 and D5 coincide in order to define the voltages Vi and DV. Actually, the curves D3 and D5 are offset and the respective minima do not coincide. The voltage DV is defined as the voltage difference between respective adjacent peaks of the skewed and unskewed folding characteristics after the unskewed curve has been shifted so that the minima of the skewed and unskewed characteristics coincide, and Vi is an offset voltage where the shifted unskewed characteristic and the skewed characteristic first intersect, as shown in FIG. 4b.

Figure 5A:
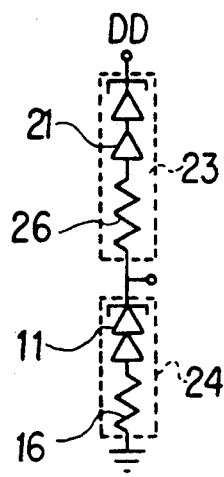
FIG. 5a is a schematic diagram of a memory cell according to the present invention with two 2-peak RTDs in series, each having a series resistance to produce a skewed folding V-I characteristics.

When two devices both having skewed characteristics are connected in series, a memory cell is also formed. Here, a memory cell according to a second embodiment of the present invention is shown in FIG. 5a wherein resistor 26 and RTD 21 form one device 23 with skewed V-I folding characteristic as shown by curve $D_{23}$, and resistor 16 and RTD 11 form another device 24 with skewed V-I folding characteristic as shown by curve $D_{24}$. The operation of the two devices 23 and 24 connected in series is graphically depicted in FIG. 5b. The stable operating points are the intersections of the positive resistance portions of curves $D_{23}$ and $D_{24}$ at points Q4, Q5 and Q6, similar to FIG. 3b. For n-peak devices, there can be n+1 stable points or quantized levels.

Figure 5B:
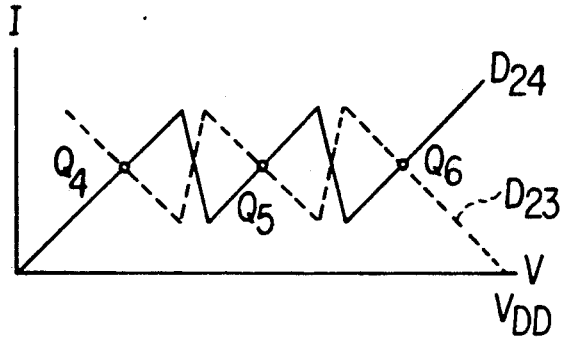
FIG. 5b is a graphical representation of the folding V-I characteristics of the memory cell shown in FIG. 5a with 3 stable operating points.

For this mode of operation, the operating voltage range can be derived from the condition that the stable operating points must lie in the range where both of the V-I folding characteristics of the series-connected devices have positive resistance. In FIG. 5(b), it can be seen that the minimum supply voltage VDD is the voltage where the current peaks of the two characteristics D23 and D24 coincide. In FIG. 4, $V_i$ is the initial offset voltage, DV is the deviation from symmetry of the current maxima of curve D3 with reference to a symmetrical characteristic D5, W is the voltage difference between adjacent current peaks. The operating range of VDD for a memory cell having two n-peak RTDs can be derived to be $nW+W/2\pm(W/2-DV)+2Vi$. The minimum supply voltage is thus $nW+DV+2Vi$.

Figure 5C:
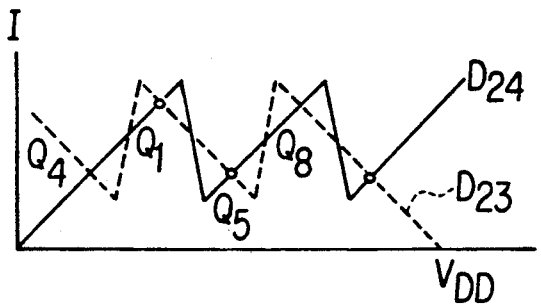
FIG. 5c is a graphical representation of the folding V-I characteristics of the memory cell shown in FIG. 5a with 5 stable operating points.

There is another mode of operation as shown in FIG. 5c. In this mode, the supply voltage VDD is changed such that each positive resistance section of curve D24 intersects the positive resistance section of curve D23 twice, resulting in stable operating points Q4, Q5, Q7 and Q8. For two n-peak devices, there can be 2n+1 stable operating points or quantized levels. From FIG. 5(c), it can be seen that the maximum supply VDD is when the two current peaks coincide and the minimum supply voltage is when the two current minima coincide. Again, using the symbols defined in FIG. 4, one can derive that the maximum supply voltage is $nW+DV+2Vi$. The minimum voltage is $nW-DV+2Vi$. Whether there are n+1 states or 2n+1 states depends on the supply voltage.

Figure 6A:
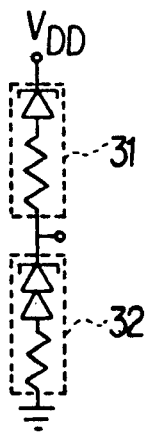
FIG. 6a is a schematic diagram of a memory cell with two RTDs in series of unequal number of peaks, each having a series resistance.
Figure 6B:
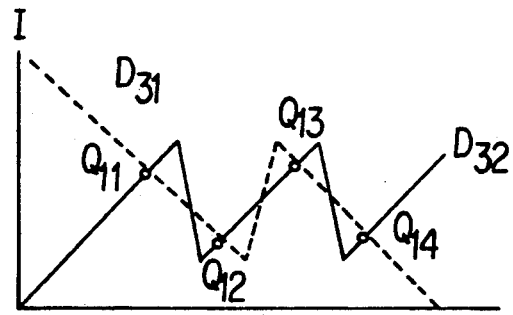
FIG. 6b is a graphical representation of the folding V-I characteristics of the memory cell shown in FIG. 6a with 4 stable operating points.

The two devices with folding V-I characteristics connected in series need not be the same. The number of peaks need not be the same. The series resistances need not be the same. FIG. 6a shows a third embodiment of the present invention wherein a two peak device 32 is connected in series with a single peak device 31. Note that in FIG. 6b there are now four stable operating points Q11, Q12, Q13 and Q14 where the positive resistance sections of the folding V-I characteristics $D_{31}$ and $D_{32}$ intersect.

Figure 7:
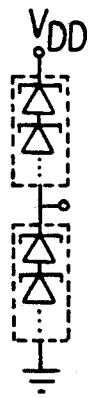
FIG. 7 is a schematic diagram of a memory cell according to the invention formed with several series-connected RTDs.

FIG. 7 shows a fourth embodiment of the present invention wherein the multiple peak folding characteristics are obtained by connecting several RTDs in series. The RTDs could have single-peak or multiple-peak folding characteristics.

In general, when an n-peak device is connected in a series with a n−1 peak device, there can be 2n stable states. The maximum supply VDD is when the two current peaks coincide and the minimum supply voltage is when the two current minima coincide. The maximum supply voltage can be derived to be $nW+DV+2Vi$ and the minimum supply voltage can be derived to be $nW-DV+2Vi$. The supply voltage VDD range to effect this operation is provided in the following Table. The supply voltage ranges for other previous conditions are also summarized in this Table.

| Number of Peaks | | Number of stored levels | Supply voltage range |
|---|---|---|---|
| Pull-down device | Pull-up device | | |
| n | n | n + 1 | $nW + W/2 + DV \pm (W/2 - DV) + 2Vi$ |
| n | n | 2n + 1 | $nW \pm DV + 2Vi$ |
| n | n − 1 | 2n | $nW \pm DV + 2Vi$ |

Figure 8:
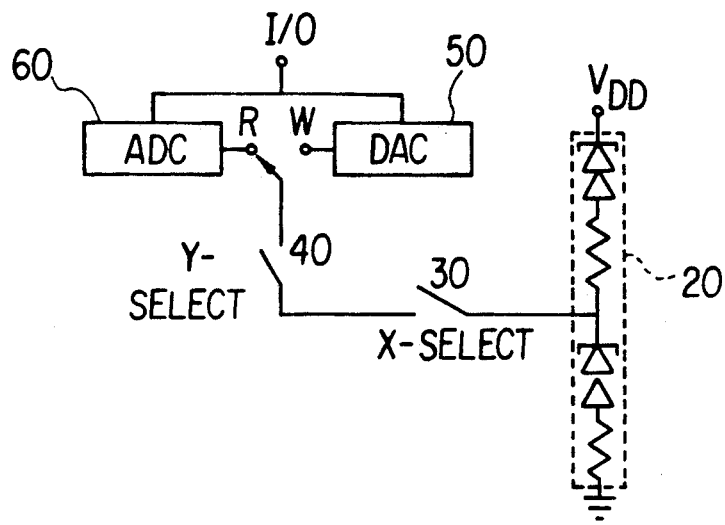
FIG. 8 is a circuit diagram of a memory system according to the present invention.

The symbols used in this table should be referenced to FIG. 4b, where n = number of peaks in folding characteristics
W = period between adjacent peaks in unit of voltage
DV = deviation from symmetry of folding characteristics
Vi = initial offset of folding characteristics A memory organization incorporating the memory cells according to the present invention is shown in FIG. 8. A memory cell 20, which can be any one shown in FIGS. 3a, 5a, or 6a, is placed at crosspoints of a conventional X-Y memory matrix. The memory cell is addressed by means of X-select 30 and Y-select 40. Such an addressing scheme is well known in the memory art. After memory cell 20 is selected by X-select 30 and Y-select 40, memory cell 20 is coupled directly to an analog signal or to a digital analog converter (DAC) 50 during writing, through which an input signal is written into the memory cell 20. The digital input signal is not limited to binary signals, which are most commonly used. The analog signal output should have the same number of quantum levels as stable operating points of the memory cell used. If the digital signal is multi-valued and has the same number of quantum levels as stable operating points of the memory cell, then DAC 50 may be omitted.

During reading, memory cell 20 is connected to an analog-to-digital converter 60. The analog information stored in the memory cell 20 is then converted into a digital signal. Again, the digital signal need not be binary. If the quantum levels of the output signal are the same as the quantum levels of the analog signal stored in memory cell 20, then the analog-to-digital converter may be omitted, and the memory cell 20 effectively stores a quantized analog signal.

Obviously numerous modifications and variations of the present invention are possible in light of the above teachings. For example, other combinations of devices with varying folding characteristics with different number of peaks, different degrees of skew and different supply voltages are also possible. It is understood that within the scope of the appended claims, the invention may be practiced otherwise than as specifically described herein.

What is claimed as new and desired to be secured by Letters Patent of the United States is:

1. A memory cell for storing plural logical states, comprising:
   a first device having a first folding voltage-current characteristic with n peaks, said first device being connected in series with a resistor thereby skewing in voltage said first folding voltage-current characteristic to obtain a skewed first folding voltage-current characteristic; and
   a second device having a second folding voltage-current characteristic with at least one peak;
   wherein said devices are adapted to be connected in series across a power supply, said power supply being adjusted to produce 2n+1 logical states, at least one of said first and second folding voltage-current characteristics has multiple peaks; and
   said first and second folding voltage-current characteristics define operating points of said memory cell which correspond to said logical states, said operating points being defined by intersections of regions of said skewed first and second folding voltage-current characteristics which correspond to a positive resistance of said first and second folding voltage-current characteristics, and said intersections being defined by overlaying said skewed first folding voltage-current characteristic with said second folding voltage-current characteristic plotted in reverse with respect to a voltage axis.

2. A memory system for storing plural logic states, comprising:

an array of memory cells;

address means for addressing said memory cells;

reading means for reading said memory cells; and writing means for writing said memory cells;

wherein said memory cells comprise a first device having a first folding voltage-current characteristic with at least n peaks, said first device being connected in series with a resistor thereby skewing in voltage said first folding electrical characteristic to obtain a skewed first folding voltage-current characteristic; and a second device having a second folding voltage-current characteristic with at least one peak;

wherein said first and second devices are adapted to be connected in series across a power supply, said power supply being adjusted to produce $2n+1$ logical states, at least one of said first and second folding voltage-current characteristics has multiple peaks; and said first and second folding voltage-current characteristics define operating points of said memory cell which correspond to said logical states, said operating points being defined by intersections of regions of said first and second folding voltage-current characteristics which correspond to a positive resistance of said first and second folding voltage-current characteristics, and said intersections being defined by overlaying said skewed first folding voltage-current characteristic with said second folding voltage-current characteristic plotted in reverse with respect to a voltage axis.

3. A memory cell as recited in claim 1, comprising adjacent peaks of said skewed first folding voltage-current characteristic being separated by a voltage W;

said skewed first folding voltage-current characteristic being overlaid with said first folding voltage-current characteristic such that minima of said overlaid skewed first and first folding voltage-current characteristics coincide, thereby defining a voltage DV which is the voltage difference between respective adjacent peaks of said overlaid skewed first and first folding voltage-current characteristics, and defining a voltage $V_i$ as the voltage at which said overlaid skewed first and first folding voltage-current characteristics first intersect with respect to zero voltage.

4. A memory cell as recited in claim 3, comprising $2n+1$ logical states being produced by said power supply being in a range of $nW \pm DV + 2V_i$.

5. A memory cell as recited in claim 3, comprising said skewed first folding voltage-current characteristic having n peaks; and said second device having a folding voltage-current characteristic having $n-1$ peaks;

wherein said power supply is adjusted to produce 2n logical states.

6. A memory cell as recited in claim 5, comprising said power supply being in a range of voltage of $nW \pm DV + 2V_i$.

7. A memory cell as recited in claim 1, wherein said first and second devices each comprise a resonant tunneling diode.

8. A memory cell as recited in claim 1, wherein said said second device comprises a resonant tunneling diode connected in series with a resistor.

9. A memory system as recited in claim 2, wherein said writing means comprises a digital to analog convertor having a number of quantized levels; and said reading means comprises an analog to digital convertor having said number of quantized levels; and each of said memory cells have a number of operating points equal to said number of quantized levels.

10. A memory cell as recited in claim 2, comprising adjacent peaks of said skewed first folding voltage-current characteristic being separated by a voltage W;

said skewed first folding characteristic being overlaid with said first folding voltage-current characteristic such that minima of said overlaid skewed first and first folding voltage-current characteristics coincide, thereby defining a voltage DV which is the voltage difference between respective adjacent peaks of said skewed first and first folding voltage-current characteristics, and defining a voltage $V_i$ as the voltage at which said overlaid first and first folding voltage-current characteristics first intersect with respect to zero voltage.

11. A memory cell as recited in claim 10, comprising said skewed first folding voltage-current characteristic having n peaks; and said second device having a folding voltage-current characteristic having $n-1$ peaks;

wherein said power supply is adjusted to produce 2n logical states.

12. A memory cell as recited in claim 10, comprising said $2n+1$ logical states being produced by said power supply being in a range of $nW \pm DV + 2V_i$.

* * * * *